United States Patent
Uckun et al.

(10) Patent No.: US 8,726,203 B1
(45) Date of Patent: May 13, 2014

(54) SYSTEM AND METHOD FOR GENERATING VIRTUAL TEST BENCHES

(71) Applicant: CyDesign Labs Inc., Palo Alto, CA (US)

(72) Inventors: Serdar Uckun, Palo Alto, CA (US); William Benjamin Schaefer, IV, Palo Alto, CA (US); Mark Flanagan Ward, Palo Alto, CA (US); Kerry Ryan Poppa, Palo Alto, CA (US); Michael Theodore Koopmans, Palo Alto, CA (US); Mark Edwin Drummond, Palo Alto, CA (US); Lee Travis Bergmann Johnson, Palo Alto, CA (US)

(73) Assignee: Cydesign, Inc., San Jose, CA (US)

( * ) Notice: Subject to any disclaimer, the term of this patent is extended or adjusted under 35 U.S.C. 154(b) by 0 days.

(21) Appl. No.: 13/870,378

(22) Filed: Apr. 25, 2013

(51) Int. Cl.
*G06F 17/50* (2006.01)

(52) U.S. Cl.
USPC .............. 716/100; 716/136; 703/6; 700/1

(58) Field of Classification Search
USPC ................ 716/100, 136; 703/6; 700/1
See application file for complete search history.

(56) References Cited

U.S. PATENT DOCUMENTS

| 6,556,954 B1 | 4/2003 | Denk et al. |
| 7,415,395 B2 | 8/2008 | Khan |
| 7,617,468 B2 * | 11/2009 | Thakur et al. ............ 716/106 |
| 2003/0105618 A1 | 6/2003 | Estevez-Schwarz |
| 2003/0154059 A1 | 8/2003 | Feldmann et al. |
| 2004/0133407 A1 | 7/2004 | Reissig |
| 2005/0071137 A1 | 3/2005 | Selvaraj et al. |
| 2005/0102596 A1 * | 5/2005 | Hekmatpour ............ 714/741 |
| 2005/0107895 A1 | 5/2005 | Pistikopoulos et al. |
| 2009/0037858 A1 * | 2/2009 | Thakur et al. ............ 716/5 |
| 2012/0227021 A1 * | 9/2012 | Huilgol ............ 716/106 |
| 2013/0174108 A1 * | 7/2013 | Boehm ............ 716/106 |

OTHER PUBLICATIONS

Hongchao, Ji et al., "A model driven approach for requirements engineering of industrial automation systems", Sep. 5, 2011, 4th International Workshop on Equation-based object oriented language and tools, Rexroth Bosch Gruop, pp. 1-23.*

Liang, Feng et al., "Model-based requirment verification: A case study", Sep. 5, 2011, Proceedings of the 9th International Modelica Conference, DOI 10.3384/ecp12076385, pp. 385-392.*

Schamai Wladimir et al., "Modelica value bindings for automated model composistion", 2012, Proceeding TMS/DEVS '12 Proceedings of the 2012 Symposium on Theory of Modeling and Simulation—DEVS Integrative M&S Symposium Article No. 31 Society for Computer Simulation International San Diego, CA, USA © 2012 table of contents ISBN: 978-1-61839-786-7.*

(Continued)

*Primary Examiner* — Stacy Whitmore
(74) *Attorney, Agent, or Firm* — Courtney IP Law; Barbara B. Courtney (57) ABSTRACT

A method and system for generating a test bench for testing a requirement is described. According to an embodiment, a test bench generator subsystem automatically chooses a test template based on a user specification of a requirement to be tested. The requirement is automatically associated with information such as parameters, context identifiers, and success criteria. The subsystem automatically generates a test bench data construct for a simulation that will test the requirement and evaluate success or failure. In an embodiment, generating the test bench includes automatically choosing a system model for the test bench.

29 Claims, 5 Drawing Sheets (56) References Cited

OTHER PUBLICATIONS

Schamai, Wladimir et al., "Virtual verification of system designs against system requirements" 2010, Models 2010 Aces-MB workshop proceedings. pp. 1-15.*

Wladimir Schamai, Phillip Helle, Peter Fritzson, and Christiaan J.J. Paredis, Virtual Verification of Systems Designs Against System Requirements, Oct. 4, 2010, Oslo, Norway.

Feng Liang, Wladimir Schamai, Olena Reogovchenko, Sara Sadeghi, Mattias Nyberg, Oeter Fritzson, Model-based Requirement Verification : A Case Study, PELAB—Programming Environment Lab, Dept. Computer Science, Linköping University, SE-581 83, Sep. 3-5, 2012 Munich, Germany.

Serdar Uckun, Tolga Kurtoglu and Peter Bonus, Model-Based Systems Engineering for the Design and Development of Complex Aerospace Systems, Oct. 18, 2011, SAE International.

* cited by examiner

SYSTEM AND METHOD FOR GENERATING VIRTUAL TEST BENCHES

FEDERALLY-SPONSORED RESEARCH AND DEVELOPMENT

This invention was made with Government support under contract HR0011-12-0044 awarded by Defense Advanced Research Projects Agency. The Government has certain rights in this invention.

FIELD OF THE INVENTION

The invention is in the fields of system engineering, modeling and simulation, and engineering design.

BACKGROUND

The design and development of complex systems almost always starts with the definition of system requirements. A requirement is a documented characteristic that a system, product, or service must possess, or a documented function that a system, product, or service must perform. A requirement identifies an attribute, capability, characteristic, or quality that was determined to be necessary for a system to have value and utility for a user. In the classical engineering approach, sets of requirements are used as inputs into the design stages of product development.

Complex systems such as aircraft, automobiles, medical devices, or mobile phones may have thousands of requirements that describe various aspects of desired system function and behavior.

Requirements are often described as "shall" statements that describe the intended behavior or function of the system, including numerical limits or target values, context of operation, and use conditions. For instance, a performance requirement for a sports car may be:

The vehicle shall accelerate from a standstill to 100 km/h in 4 seconds or less on dry hard surface roads.

A performance requirement for a truck may be:

The cold engine shall start after no more than 15 seconds of cranking at ambient temperatures between −30 degrees Celsius and −15 degrees Celsius and at sea level pressure.

As a final example, a performance requirement for a rocket may be:

The rocket shall be capable of carrying a payload of 200 kg to an orbit of between 400 to 600 km and between 40% and 50% inclination.

Another important aspect of system engineering and engineering design is verification. The verification process ascertains that the designed system meets a set of initial design requirements, specifications, and regulations. Thus, requirements are an important input into the verification process. In fact, all requirements should be verifiable. The most common verification method is by test. Other verification methods include analysis, demonstration, simulation, or manual inspection of the design.

In traditional system engineering, verification by test is typically performed by building prototypes and developing test programs to verify specific requirements using the prototypes. In the case of the sports car mentioned above, the gold standard for testing the acceleration requirement would be to build a prototype, take the prototype on to a representative test track, find a skilled driver to drive the car around the track, and observe whether the car meets the acceleration requirement. In order to save time and cost, it is customary to bundle multiple verification activities in a single test program. In the example of the sports car, multiple requirements such as acceleration, top speed, and braking distance can be verified using the same test track setup.

The cold start time requirement for the truck may be tested by building a prototype and taking it to a cold climate (or a special test chamber) where the environmental conditions specified in the requirement may be replicated.

Finally, the rocket could be tested by building a prototype and launching a representative payload to space.

There are several undesirable aspects of using prototypes for verification by test. Prototypes are costly to design and build. If the test fails, a new prototype needs to be designed, built, and tested again. Also, if a requirement is modified, the tests have to be repeated. For instance, each rocket launch may cost tens of millions of dollars, resulting in a very expensive test program. Further, depending on the test, it may or may not be possible to repeat the test under different circumstances in order to understand the limits of performance. For instance, the prototype rocket mentioned in the example above would be spent during the test, making it cost-prohibitive to run multiple tests with different size payloads or various orbits.

Testing a prototype is often not an optimum verification method because the tests are difficult and expensive to set up and execute. For instance, the truck cold start time requirement necessitates extremely cold temperatures. While an environmental chamber is a convenient setup for such a test, it may be impossible to find an environmental chamber large enough to accommodate the prototype truck. The only option may be to haul the truck and all associated test hardware to a cold climate for winter testing, adding further cost and time delays to the test program. Also, tests might have health or safety consequences. Weapons or rocket testing is an obvious example (for instance, the Nedelin disaster in Russia in 1960 resulted in many deaths). Other examples include testing of biomedical devices (e.g., pacemakers or insulin pumps) on animals or humans, or crash testing of aircraft.

Use of computer models to analyze or predict system behavior or performance is well known in the art. In fact, the entire field of Computer-Aided Engineering (CAE) is dedicated to analyzing system behavior using mathematical models of physical systems. Several modeling languages, tools, and environments have been developed for this purpose, including Matlab™ and Simulink™ (from MathWorks), Modelica™ (an open language sponsored by the Modelica Association), ANSYS™, ADAMS™ (from MSC Software), Simulia™ (from Dassault Systemes), and others.

An alternative to using hardware prototypes for verification by test is to run simulations using virtual prototypes. A virtual prototype is a computer model of a system design that emulates the function, behavior, and structure of a physical instantiation of that design. Using a virtual prototype, one could verify several requirements which would normally necessitate expensive hardware prototypes and complex test programs.

In the academic literature, there are a few examples of using virtual prototypes instead of actual prototypes to verify performance requirements. In the automotive industry, virtual crash tests are often used to verify certain passenger safety requirements. Indeed, there are several advantages to using virtual prototypes. Experiments conducted using virtual prototypes are inherently safe. Virtual prototypes can emulate the structure, behavior, and function of a hardware prototype, obviating the need to build test hardware or test rigs. Virtual prototypes can be used for destructive testing at no additional cost. Unlike hardware prototypes that are destroyed during testing, virtual prototypes may be created and tested over and over at will. Virtual prototypes may be used to study the limits of performance. For instance, it may be valuable to test the acceleration performance of the sports car under various road, environmental, load, and driver conditions. Using a virtual prototype, many tests can be run under varying conditions, providing a more robust prediction of the eventual performance of the system in the real world. Indeed, there are recent developments to estimate the probability of correctness of a given design by simulating the same design many times and varying certain model parameters and input variables.

However, there are several limitations in current methods that dramatically limit the use of virtual prototypes to verify requirements. Existing approaches require manual configuration of tests for each requirement, including selection of the most appropriate simulation method, composition of models, setting execution conditions, determining a proper sequence of simulations, and defining success criteria for the test. There is currently no method for identifying the most appropriate mathematical model to use, in order to verify a given requirement. There is no method for identifying and modeling the most appropriate context (environment) for a given test. There is currently no method for selecting the most appropriate external stimuli (such as user inputs or external events) for a given test (if applicable). There is currently no method for identifying the most appropriate probes/measurement points into a simulation to verify a given requirement. And there is currently no method for creating and optimizing tests to verify multiple requirements concurrently. In the example of the sports car, the multiple requirements of acceleration, top speed, and braking distance can be verified using the same test track setup. However, currently a human must either manually design three tests (one for each requirement) or manually design a single test that will verify the three requirements.

Figure 1:
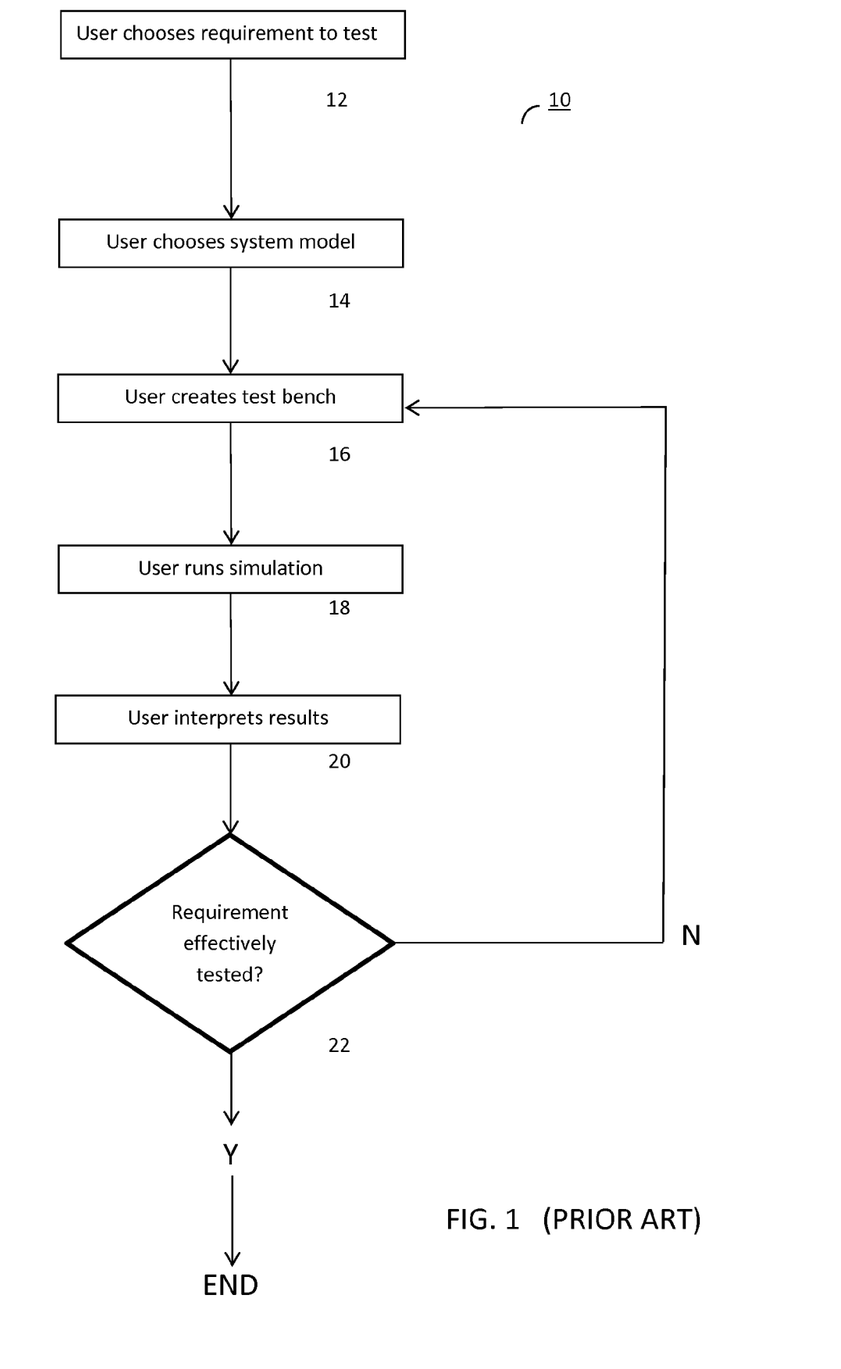
FIG. 1 is a flow diagram illustrating a prior art method of testing a given requirement.

FIG. 1 is a flow diagram illustrating a prior art method 10 for testing a given requirement. The user chooses a requirement to be tested at 12. The user also chooses a system model at 14. Typically system models already exist and the user intelligently finds the correct one for testing the given requirement. The user then manually creates a test bench (16). This involves writing instructions in a predetermined language, or essentially, writing a small software program or script for execution by a processor. At 18, the user runs a simulation by executing the test bench program. At 20, the user manually interprets the results, which includes determining whether the test bench was appropriate to test the requirement as well as whether the requirement was met. If the test bench did not succeed in testing the requirement, as shown at 22, the user must go back to 16 and create a new test bench that hopefully avoids the problems that caused the previous test bench to fail.

In the current literature, there are examples of how such a requirement may be verified using a virtual prototype. However, that literature does not describe how to generate the test without user intervention. For instance, Model-Based Requirement Verification: A Case Study (Feng Liang, et al. 9$^{th}$ International Modelica™ Conference Proceedings, September 2012, Munich) requires user intervention to "select or create design model to be verified against requirements" and to "select or create verification scenarios." The method is silent as to how the context (environment model, such as road or atmospheric conditions) or the external stimuli (such as driver inputs) might be selected and incorporated into the test. Model-Based Systems Engineering for the Design and Development of Complex Aerospace Systems (Serdar Uckun, et al. SAE International, October 2011) discusses how to measure the impact of design uncertainty in verification results, but it does not teach the integration of requirements with the test benches in an automated fashion. Methods (1) and (2) both assume that the verification will be performed using the Modelica™ language, and are both silent as to how to select the best simulation method if it is not feasible to use Modelica™.

DETAILED DESCRIPTION

What is disclosed is a system and method for generating virtual test benches for automated verification of system requirements. The disclosed method improves the state of the art by automating several aspects of the test generation process, including model selection, model composition, test configuration, and selection of appropriate environment and context models.

Figure 2:
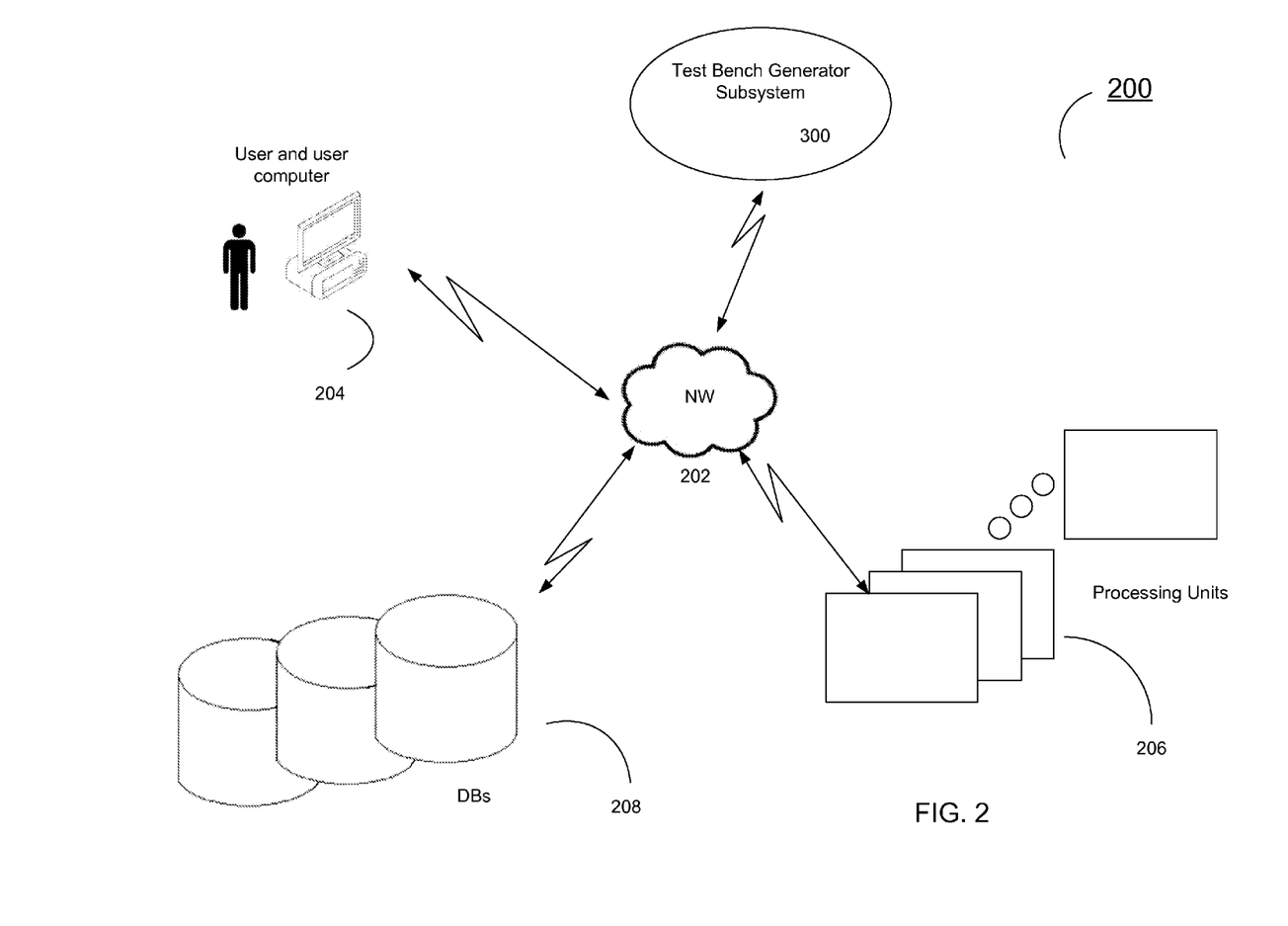
FIG. 2 is a block diagram of a requirements testing system according to an embodiment

FIG. 2 is a block diagram of a requirements testing system 200 according to an embodiment. System 200 includes a test bench generator subsystem 300 in communication with at least one network 202. For purposes of this disclosure, network 202 is also referred to as the Internet. However, the processes described herein can be performed on any type of data communication network, including local area networks (LANs) and wide area networks (WANs). Accordingly, network 202 is understood to include one or more of the Internet and any other known wired or wireless communication network. Test bench generator subsystem 300 communicates with various databases 208 which can physically reside anywhere, and can be distributed geographically, even though the databases 208 are shown grouped in the figure.

Similarly, processing units 206 can reside anywhere, be of any number, and communicate with databases 208 and test bench generator subsystem 300 over network 202. Processing units 206 are shown as a group in the figure, but any number of processing units 206 can be physically distributed in any manner provided each processing unit 206 has access to the network 202. As further described below, processing units 206 process data for generating test benches. In some embodiments, processing units 206 perform data processing along with, or in addition to, processing units that are more closely associated with test bench generator subsystem 300, or that are resident on test bench generator subsystem 300.

A user computer 204 includes any machine capable of presenting a user interface (UI) to the user. In various embodiments, a test bench generator subsystem UI interacts with the user to generate a test bench as further described below.

Figure 3:
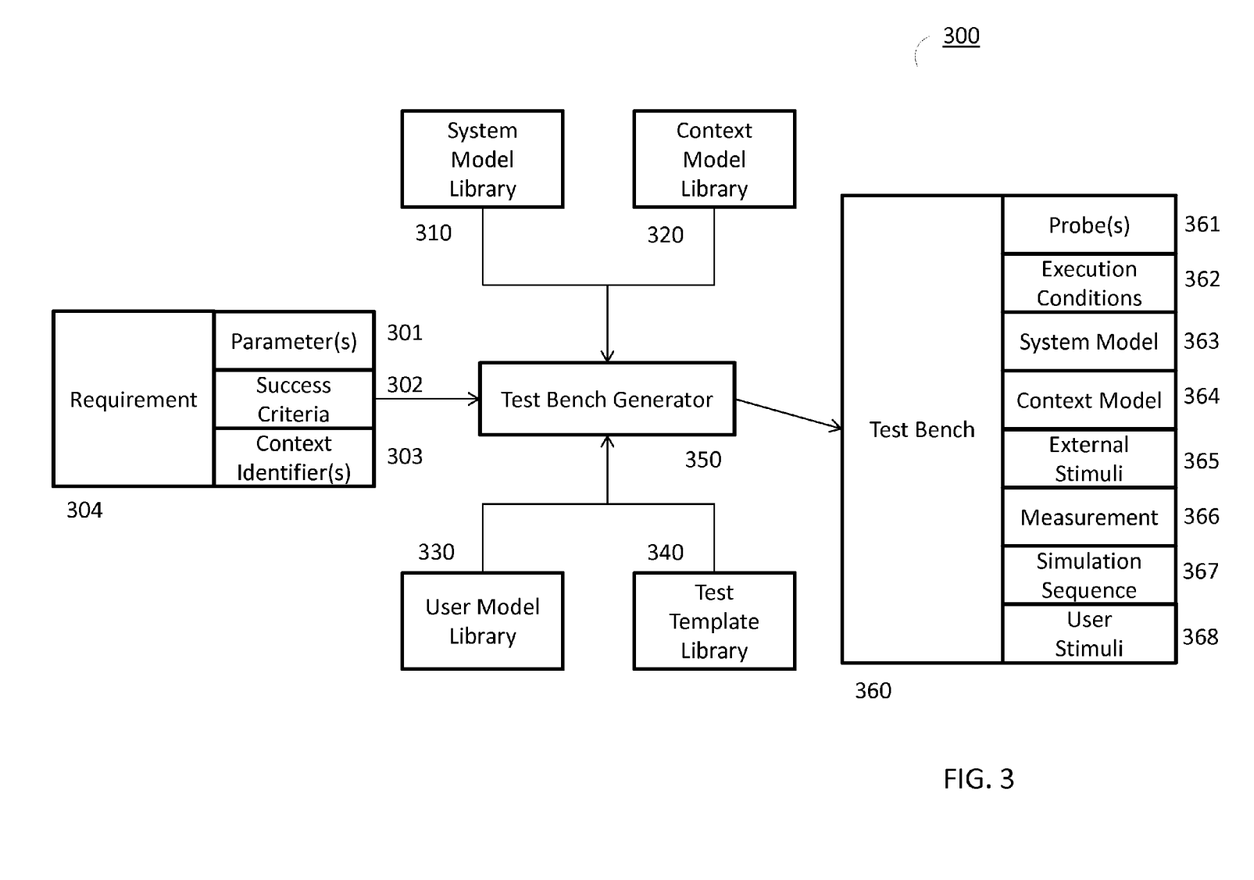
FIG. 3 is a block diagram of a test bench generator subsystem according to an embodiment.

FIG. 3 is a block diagram of an embodiment of a test bench generator subsystem 300 for generating virtual test benches for automated verification of system requirements. Referring to FIG. 3, the first step in generating a test bench is for a user to specify one or more requirements 304 regarding the system to be designed. Without losing generality, these might be requirements about the expected performance of the system, the safety of the system, or a particular function of the system. Each requirement 304 refers to one or more parameters 301 of the system. For instance, a requirement regarding the top speed of the vehicle would refer to a "speed" parameter (which may be further specified as "forward" or "reverse" speed, if necessary).

Each requirement further refers to one or more success criteria 302 which are specified in the context of parameter(s) 301. For instance, a top speed requirement may read as "the vehicle shall have a top speed of no less than 120 km/h". In this case, the success criterion is to reach or exceed a maximum speed of 120 km/h during a test run (or a simulation of a test run using a virtual prototype).

Without losing generality, each requirement 304 may further refer to context identifier(s) 303 which specify the external conditions under which the test ought to be conducted (or a simulation should be executed). For instance, context identifiers may specify the applicable track surface properties, atmospheric conditions, sea state conditions (for watercraft), weather conditions (for aircraft), and so on.

A test bench generator module 350 stores each requirement 304, along with all associated information 301-303 in a database, text file, XML file, or similar electronic data storage medium. It is not particularly important how the requirement data is stored as long as that data is retrievable later on.

In an embodiment, subsystem 300 includes a system model library 310. System models are known in the art, and there are many different types of models consistent with different modeling methods (e.g., continuous system models, discrete event models, functional models, and so on). Further, these models may be developed (and stored) using a variety of off-the-shelf methods or tools without losing generality. According to embodiments described herein, an appropriate model is retrievable for the use of the test bench generator 350, either from the library 310 or another source (such as from databases 208 for example). An appropriate model describes the behavior or function of the system. In FIG. 3, the system model library 310 is shown as part of the subsystem 300, but in other embodiments, models could be obtained from a local or remote storage location of any kind. Thus, the system model library 310 contains one or more system models, and it may not have to be known as a "library" as long as there is at least one system model 363 available for testing.

Similarly, a context model library 320 is an optional capability of the subsystem 300. There are many current methods for modeling context elements such as road profiles, road conditions, sea state, atmospheric conditions, and so on. Further, these models may be developed (and stored) using a variety of off-the-shelf methods or tools without losing generality. In other embodiments, a context model library may be absent, and context models are retrieved from another source. For purposes of the subsystem 300, one or more context models 364 are optionally retrieved (from any source, local or remote) for generating a test bench instance 360. The one or more context models 364 describe the environmental conditions that the system under test operates in. When available, context models improve the performance of the system and method described here, but in some embodiments, context models are omitted. In an embodiment, the test bench generator 350 uses the context model library 364 to generate optional external stimuli 365 related to the context or environment of the simulation. For example, external stimuli 365 can include lightning strikes, periodic extreme temperature excursions, and exposure to moisture or immersion in water.

Further, subsystem 300 is shown to include a user model library 330. User models are known, and there are many methods for modeling the interactions of the user (for instance, a driver or pilot) with the system under test. These models may be developed (and stored) using a variety of off-the-shelf methods or tools without losing generality. Subsystem 300 can choose a user model from the library 330 or retrieve one from another source. In either case, subsystem 300 uses a user model to generate user stimuli 368 for the simulation. User stimuli 368 describe the behavior and actions of the user during the test (for instance, full throttle operation, or hard braking, or different reaction times). When available, user models improve the performance of the system and method described here, but in some embodiments user models are omitted. For instance, automated operation for a missile does not require a user model.

Subsystem 100 also includes a test template library 340. Test templates are not necessary to the system and method, but are an optional capability. Test templates define the execution conditions and other relevant attributes of a test. Execution conditions include start and stop conditions, and broadly define what happens during a test. For instance, execution conditions may specify that a test that starts with a set of initial conditions (t=0, etc.), and then when some condition is reached, an action takes place (e.g., at time=t1, start collecting data from probe p1). Test templates may also define standard transformations of data collected via probes into measurements that are used to evaluate requirements, e.g., maximum value, root mean square (RMS) value, gain margin, statistical mean, and so on. Examples of test templates in the automotive domain include a 1 km distance run, 1 minute timed run, run until fuel is exhausted, etc. These templates may be developed (and stored) using a variety of off-the-shelf methods or tools without losing generality. A test template is retrieved, either from the library 340 or from any other source, and used to define execution conditions 362. Test templates are not necessary for the system and method to function. If such templates are not available, the user would simply define an appropriate test template himself.

Test bench generator 350 performs a method of automating the test bench creation process as much as possible. Given a requirement 304, the test bench generator 350 uses the retrieved data components as previously described (e.g. parameters and success criteria) to create a test bench instance 360. The test bench 360 is a computer data structure and it may be implemented in a variety of ways (e.g., as an XML data structure, a series of relational database records, etc.) without losing generality. In an embodiment, at least one test bench instance 360 corresponds to each requirement 304 that is subject to verification by test. Each test bench 360 is based on a test template. Test templates may be retrieved from a test template library 340 (or elsewhere), or the user may define one. The user selects or defines the most appropriate test template for each occasion.

In various embodiments, the selection of test templates is automated. In one embodiment, a table lookup is used to choose the appropriate test template for each requirement. Specifically, each target parameter is mapped to a particular test template. For instance, using examples from the automotive domain, the following test template selection criteria are possible:

Target parameter: speed
Test template: 5 km distance run (top speed will be reached and measured during this run)
Target parameter: acceleration
Test template: 1 minute run (acceleration will be measured at the beginning of this run)
Target parameter: braking distance
Test template: 1 km distance run (braking will be applied during this run)
Target parameter: range
Test template: 5,000 km distance run (fuel is likely to be exhausted during this run)

Target parameter: turning radius

Test template: 1 km distance run (turns will be executed during this run)

Target parameter: engine temperature

Test template: 100 km distance run (engine will reach its maximum operating temperature during this run)

In certain cases, a single test bench might be composed of a sequence of analyses, transforms, and processing operations. One example is stability analysis of an electrical power system, which often involves bringing the system up from dead zero to a steady state, and then performing the necessary measurement(s). This could be described as two (or more) test benches (one to bring the system up to steady state, another to operate the system at that steady state). Alternately, it could a single test bench with an appropriately devised input stimulus. Another example is testing the frequency response of a system (i.e. the simulated equivalent of a spectrum analyzer that injects a series of sinusoids into the system and measures the frequency response.) In such circumstances, it may be necessary for the test template to include a simulation sequence 367, including what parameters are handed off from one simulation to the next. However, a simulation sequence is not a necessary element of a composed test bench 360. Rather, it is only used in cases where a sequence of simulations is necessary to complete a test bench 360.

Next, the test bench generator 350 selects a system model from the system model library 310 (or from elsewhere, as previously described). In order to select the most appropriate model, the test bench generator 350 searches for all system models that output the system parameter(s) 301 that are of interest. For instance, if the requirement is about the top speed of the vehicle, the test bench generator searches for all models that output the desired speed parameter. If there are multiple models that output the desired parameter, the test bench generator uses a set of criteria to select the most appropriate one. The specific criteria used in this selection process are variable in different embodiments. For instance, the test bench generator could choose the simplest model (or the most complex model) that outputs the desired parameter. Various methods for searching for appropriate models include using metadata to tag all parameters that are output by each model. In another embodiment, a database management system is used to relate requirements to parameters, and parameters to models. In yet another embodiment, ontology or taxonomy is used to relate requirements to parameters, and parameters to models. In yet another embodiment, the test bench generator could search the system model libraries of other users to find what system architectures resulted in tests that satisfy a particular requirement. Once the system model is selected, the test bench generator incorporates that system model 363 in the test bench 360.

The system model selection process is automated according to an embodiment. In one embodiment, a table lookup is used to choose the appropriate system model for each requirement. Specifically, each target parameter is mapped to a particular model that provides the target parameter as output. In one example, the model selection process determines that the appropriate model is the simplest one that provides the requested information. Using examples from the automotive domain to illustrate this, assume that that there are three available powertrain models. The first model outputs vehicle speed only. The second model outputs vehicle speed and engine oil temperature. The third model outputs vehicle speed, engine oil temperature, and fuel level. For a top speed requirement, the first model is chosen. For an engine temperature requirement, the second model is chosen. For a range requirement, the third model is chosen because the test bench needs to probe range (speed integrated over time) as well as fuel level.

Next, the test bench generator 360 selects a context model 364 using context identifiers 303 from the context model library 320 (or elsewhere). Context identifiers are phrases that the user selects during the requirements elicitation phase. For instance, these phrases may include road grade identifiers such as "flat", "x % grade upslope", or "y % grade downslope"; road surface identifiers such as "hard", "dirt", "mud", or "gravel"; precipitation identifiers such as "dry", "wet", or "ice"; and other atmospheric condition identifiers such as "sea level" or "x thousand feet elevation."

In one embodiment, the models in the context library 320 are tagged with metadata based on the context identifiers. The metadata is used to find the appropriate context models that match the identifiers selected by the user. For instance, a particular requirement may state "icy, hard surface roads with a 30% upslope" as the context identifier(s). Using this information, the test bench generator 350 selects a hard surface road model, applies a 30% grade to it, and incorporates the appropriate friction and slip models consistent with icy road conditions. The test bench generator 350 also selects a user model from the user model library 330 (or elsewhere), and generates user stimuli 368 from the user model. Alternatively, the user may select the most appropriate context model and user model for each test bench instance 360.

Next, the test bench generator 350 composes an end-to-end system simulation using the system model, the context model, and the user model. The test bench generator 350 uses the execution conditions indicated in the test template to set the execution conditions for the simulation. For instance, a 1 km run starts at time=0, position=0 km and speed=0. The run ends when the position marker reaches 1 km.

Next, the test bench generator creates a probe 361 for each output parameter that the test bench 350 needs to track (as defined by the requirement(s)). For instance, the top speed requirement needs to be tracked using a speed probe. In an embodiment, the speed probe is an algorithm or other computational construct that observes the model output data for the parameter of interest. In the case of the top speed requirement, the speed probe collects the time series data for the speed parameter of the system model.

Finally, the test bench generator 350 uses the success criteria 302 to construct a measurement algorithm 366 for determining whether a requirement was met during the test of the requirement. For instance, if the requirement states that the top speed of the vehicle shall be no less than 180 km/h, the test bench generator generates an algorithm that utilizes the time series data that is collected by the speed probe and determines the highest (maximum) value in that time series. This algorithm is referred to as the measurement algorithm 366, and the output of the measurement algorithm is compared to the requirement.

Embodiments of the claimed invention generate a test bench 360 which includes an executable simulation. In one aspect of the system, the simulation is executed so as to use processing resources more efficiently. For example, computational tasks not depending in a serial manner on other tasks are identified and executed in parallel by similar threads or similar sets of computational resources. In general, computational resource usage can be optimized in any manner given the characteristics of the processing resources and of the tasks to be performed within the simulation. Also, as previously mentioned, the processing resources can be distributed over a communication network in any known manner, and the scheduling and allocation of the computing resources is similarly distributable.

Embodiments of the invention also provide for conservation of resources by avoiding performing computational tasks that were previously performed. For example, once a test bench is composed (minimally consisting of a particular system model, optional context model, optional user model, and execution conditions), a record is made of the particular details of the test bench. In addition, the results of test bench execution are cached and associated with that particular record. If the exact same test bench is requested at a later time, this arrangement allows the user to simply retrieve previous results without having to execute the simulation again, thus saving considerable time and resources. In one embodiment, the record of a particular test bench consists of a hash computed using a Modelica™ model representing the entire test bench, but embodiments are not so limited. A similar hash is computed for each new test bench request and compared to all other hash records in the database. If there is a match, the match indicates that the exact same test bench was executed previously.

As discussed above, multiple requirements may be tested concurrently if they can be evaluated using the exact same test bench. In an embodiment, the previously discussed caching mechanism is used for this purpose. For instance, let's assume that there is a top speed requirement and an acceleration requirement for a sports car. Both tests may be executed using the same test bench. In fact, the simulation needs to be run only once. In this particular case, a test bench is constructed and executed for the top speed requirement. A hash is generated and recorded along with simulation results. Then, a second test bench is generated for the acceleration requirement and a hash computed for the second test bench. Since the second test bench will yield the exact same hash, the system returns the recorded results of the first simulation rather than running the simulation a second time.

Once the simulation is executed through a user command or some automated process, the test bench 360 collects the output data using the probe(s) 361, applies the measurement 366 to this output data, and determines whether the system model 363 is able to meet the requirement 304 under the conditions set forth in the test bench generator 350.

Figure 4A:
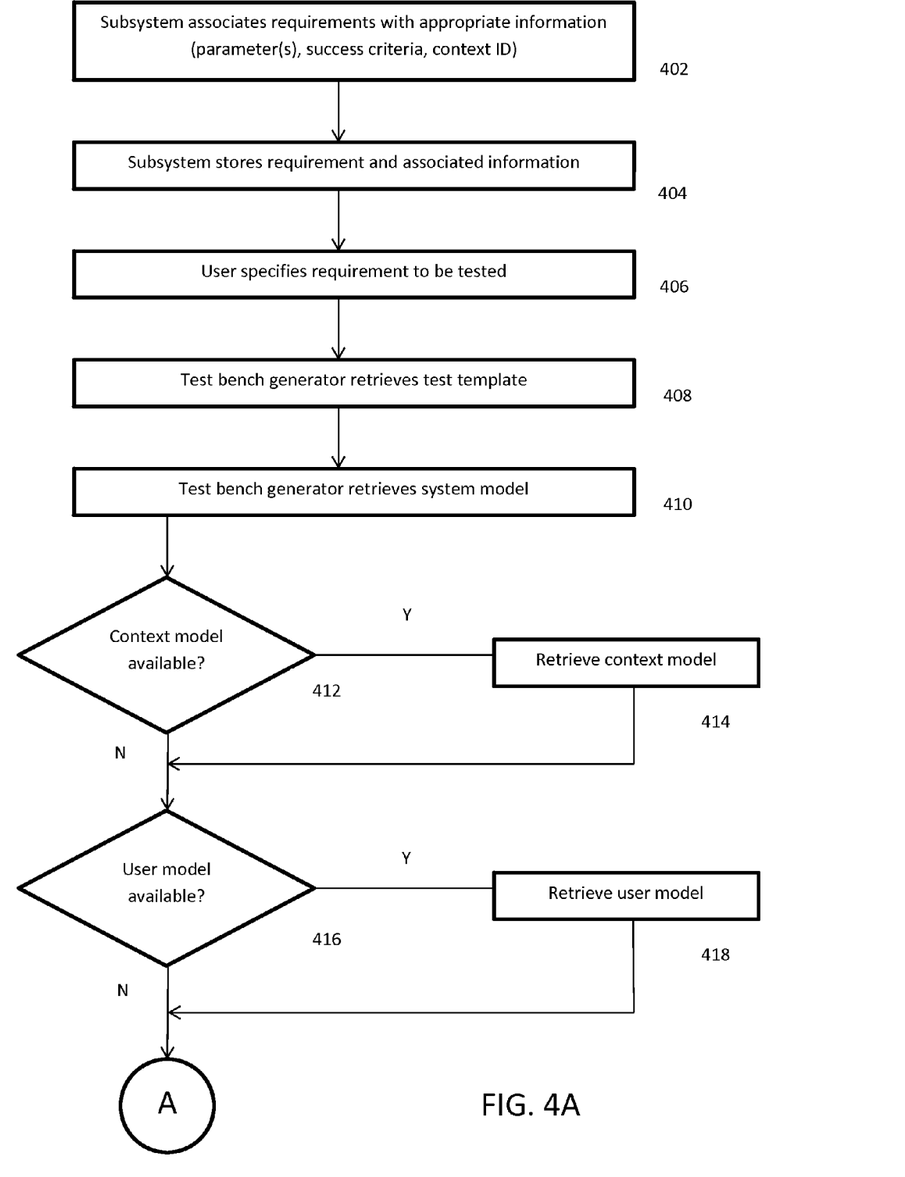
FIGS. 4A and 4B make up a flow diagram illustrating test bench generation according to an embodiment.
Figure 4B:
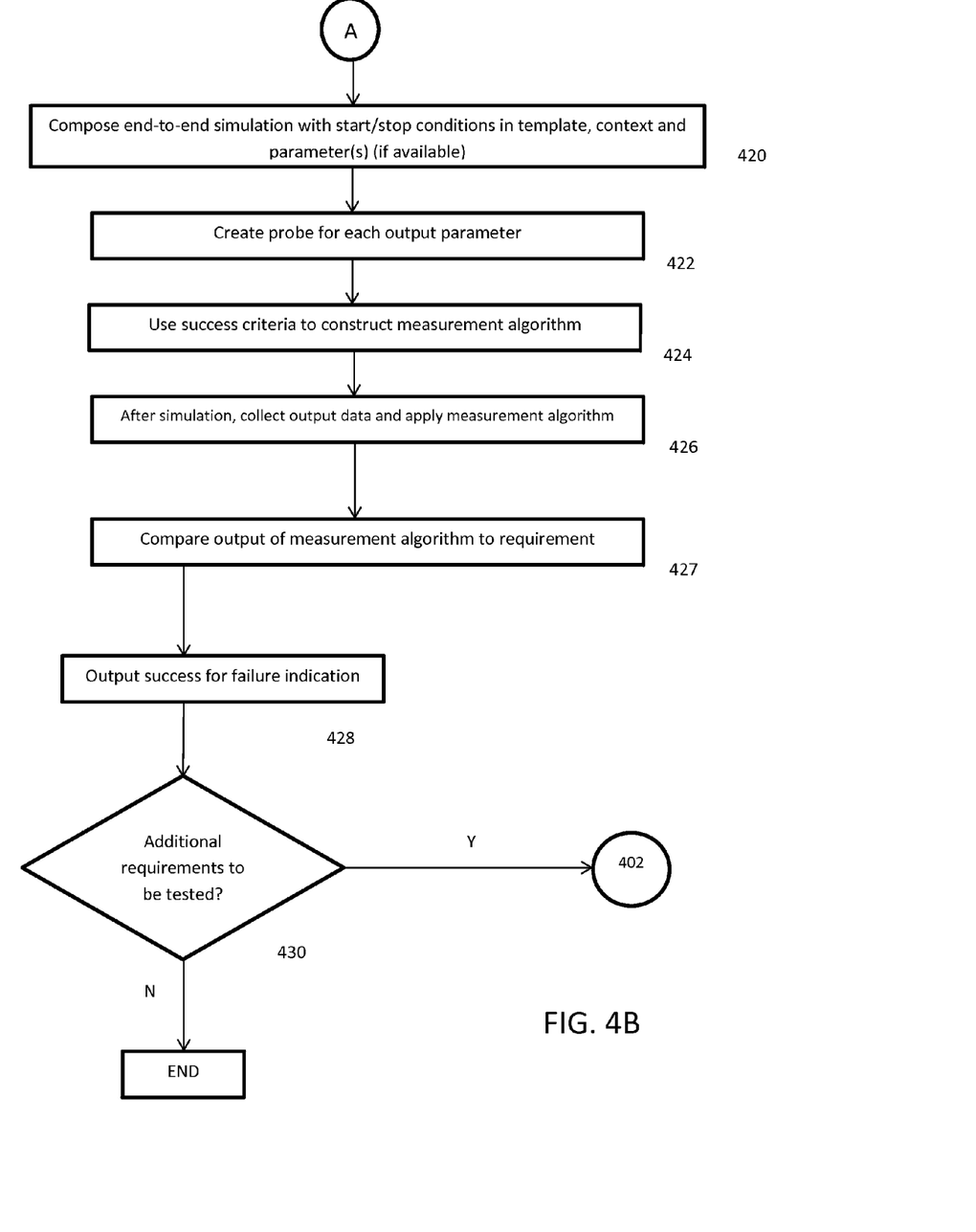

FIGS. 4A and 4B make up a flow chart illustrating the process of test bench generation according to an embodiment. At 402 the test bench generation subsystem associates requirements with appropriate information, including parameter(s), success criteria, and context ID. The subsystem stores 404 the requirement information and associated information. When a user specifies a requirement to be tested 406, the test bench generator retrieves an appropriate test template 408. The test bench generator also retrieves a system model 410, and determines whether there is a context model available 412. If there is an available context model, it is retrieved 414. The test bench generator also determines whether there is a user model available 416, and if so, retrieves the user model at 418.

The test bench generator uses the requirement and the retrieves information to compose an end-to-end simulation using execution conditions in the template, and any available context information and parameters 420. A probe is then created for each output parameter 422. The success criteria are used to construct a measurement algorithm 424. After the simulation, the measurement algorithm is applied to the collected output data 426. The output of the measurement algorithm is compared against the requirement 427. If the comparison indicates the requirement was met, a success indication is output at 428. If the comparison indicates the requirement was not met, a failure indication is output at 428.

If there are additional requirements to be tested 430, then the process returns to 402 where the subsystem associates the additional requirements with appropriate information. Otherwise the process ends.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various functions or processes disclosed herein may be described as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the interne and/or other computer networks via one or more data transfer protocols (e.g., HTTP, FTP, SMTP, etc.). When received within a computer system via one or more computer-readable media, such data and/or instruction-based expressions of components and/or processes under the system described may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

While certain aspects of the systems and methods are presented below in certain claim forms, the inventors contemplate the various aspects of the systems and methods in any number of claim forms. For example, while only one aspect of the systems and methods may be recited as embodied in machine-readable medium, other aspects may likewise be embodied in machine-readable medium. Accordingly, the inventors reserve the right to add additional claims after filing the application to pursue such additional claim forms for other aspects of the systems and methods.

What is claimed is:

1. A system comprising:
    a plurality of data processing units coupled to at least one network;
    at least one user input device coupled to the at least one network;
    a plurality of databases coupled to the at least one network; and
    at least one processor coupled to the at least one network and configured to execute a test bench generator subsystem, the test bench generator subsystem comprising a test bench generator module configurable to automatically compose an end-to-end simulation for testing a requirement, wherein composing comprises,
        automatically associating the requirement with appropriate information;
        in response to a user specifying that the requirement is to be tested, automatically retrieving a test template;
        automatically retrieving a system model; and
        automatically composing the end-to-end simulation.

2. The system of claim 1, wherein the appropriate information includes one or more parameters, success criteria, and context identifiers.

3. The system of claim 1, wherein the test bench generator module is further configurable to:
    determine whether a context model is available; and
    if a context model is available, automatically retrieve the context model.

4. The system of claim 1, wherein the test bench generator module is further configurable to:
    determine whether a user model is available; and
    if a user model is available, automatically retrieve the user model.

5. The system of claim 1, wherein the test bench generator module is further configurable to create sets of data from the system model.

6. The system of claim 5, wherein the sets of data created by the test bench generator module comprise a simulation sequence for testing a requirement.

7. The system of claim 5, wherein the sets of data created by the test bench generator module comprise one or more probes, wherein a probe is configured to track a parameter as defined by a requirement.

8. The system of claim 5, wherein the sets of data created by the test bench generator module comprise execution conditions for testing a requirement.

9. The system of claim 5, wherein the sets of data created by the test bench generator module comprise external stimuli for testing a requirement.

10. The system of claim 5, wherein the sets of data created by the test bench generator module comprise a measurement algorithm for determining whether a requirement was met during the test of the requirement.

11. A computer-implemented method for testing a requirement, the method comprising:
    a processor receiving and storing requirements and information associated with the requirements, wherein a requirement comprises a predefined characteristic of a system;
    the processor executing a test bench generator subsystem module, wherein,
        the test bench generator subsystem module receives user input specifying a requirement to be tested;
        the test bench generator subsystem module automatically retrieves a test template from a database;
        the test bench generator subsystem module automatically retrieves one or more of a plurality of data models from the database; and
        the test bench generator subsystem module automatically composes a simulation for testing the specified requirement, wherein the simulation comprises an executable test bench data construct.

12. The computer-implemented method of claim 11, further comprising the test bench generator subsystem module automatically associating the requirements with the information.

13. The computer-implemented method of claim 11, wherein the information associated with the requirements comprises one or more parameters, success criteria, and one or more context identifiers.

14. The computer-implemented method of claim 11, wherein the plurality of models comprise a system model, a user model, and a context model.

15. The computer-implemented method of claim 11, wherein composing the simulation comprises the test bench generator subsystem module creating external stimuli based the one or more data models.

16. The computer-implemented method of claim 11, wherein composing the simulation comprises the test bench generator subsystem module creating execution conditions based on the test template.

17. The computer-implemented method of claim 11, wherein composing the simulation comprises the test bench generator subsystem module creating a measurement algorithm for determining whether the specified requirement was met.

18. The computer-implemented method of claim 17, wherein creating the measurement algorithm comprises the test bench generator subsystem module using the information associated with the requirements.

19. The computer-implemented method of claim 11, wherein composing the simulation comprises the test bench generator subsystem module creating a simulation sequence.

20. The computer-implemented method of claim 11 further comprising:
   the test bench generator subsystem module collecting output data after execution of the test bench construct; and
   the test bench generator subsystem module determining whether the requirement was met.

21. The computer-implemented method of claim 11, further comprising one or more processors performing the simulation, comprising executing the test bench construct, wherein executing comprises scheduling and performing a plurality of data processing tasks on the one or more processors.

22. The computer-implemented method of claim 21, wherein executing the test bench construct further comprises scheduling and performing a plurality of data processing tasks in parallel on the one or more processors.

23. A non-transitory computer readable medium having instruction stored thereon which, when executed by a processor perform a requirement testing method, the method comprising:
   automatically choosing a test template based on a user specification of a requirement to be tested;
   automatically associating the requirement with information comprising one or more of at least one parameter, at least one context identifier, and success criteria;
   automatically selecting at least one model for generating a test bench, wherein the test bench comprises a data construct for a computer simulation that tests the requirement for compliance the success criteria, wherein the at least one model comprises a system model that models the system to be tested for compliance with the requirement; and
   automatically generating the test bench, comprising creating sets of data from the at least one model for inclusion in the test bench.

24. The non-transitory computer readable medium of claim 23, wherein the sets of data comprise one or more probes for monitoring one or more predefined conditions.

25. The non-transitory computer readable medium of claim 23, wherein the sets of data comprise execution conditions for the simulation.

26. The non-transitory computer readable medium of claim 23, wherein the sets of data comprise external stimuli.

27. The non-transitory computer readable medium of claim 23, wherein the sets of data comprise a simulation sequence.

28. The non-transitory computer readable medium of claim 23, wherein the at least one model further comprises a system model that models the system to be tested for compliance with the requirement, a context model that models a context for the simulation, and a user model that models a user of the system to be tested.

29. The non-transitory computer readable medium of claim 23, further comprising automatically evaluating an output of the simulation to determine whether the requirement was met.

* * * * *